United States Patent
Cai et al.

(10) Patent No.: US 9,425,319 B2
(45) Date of Patent: Aug. 23, 2016

(54) INTEGRATED CIRCUITS INCLUDING FINFET DEVICES WITH LOWER CONTACT RESISTANCE AND REDUCED PARASITIC CAPACITANCE AND METHODS FOR FABRICATING THE SAME

(71) Applicants: GLOBALFOUNDRIES, Inc., Grand Cayman (KY); International Business Machines Corporation, Armonk, NY (US)

(72) Inventors: Xiuyu Cai, Niskayuna, NY (US); Ruilong Xie, Niskayuna, NY (US); Ali Khakifirooz, Mountain View, CA (US); Kangguo Cheng, Schenectady, NY (US)

(73) Assignees: GLOBALFOUNDRIES, INC., Grand Cayman (KY); INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 14/551,606

(22) Filed: Nov. 24, 2014

(65) Prior Publication Data
US 2015/0102422 A1 Apr. 16, 2015

Related U.S. Application Data

(62) Division of application No. 13/759,156, filed on Feb. 5, 2013, now Pat. No. 8,921,191.

(51) Int. Cl.
*H01L 27/088* (2006.01)
*H01L 29/06* (2006.01)
(Continued)

(52) U.S. Cl.
CPC .......... *H01L 29/7853* (2013.01); *H01L 21/28* (2013.01); *H01L 21/823431* (2013.01);
(Continued)

(58) Field of Classification Search
CPC ........... H01L 21/28; H01L 21/823431; H01L 21/823821; H01L 27/0886; H01L 29/66795; H01L 29/785; H01L 29/41791; H01L 29/458; H01L 29/7853; H01L 29/0653
USPC .................................. 257/383, 384, 386, 389
See application file for complete search history.

(56) References Cited

U.S. PATENT DOCUMENTS

| | | | | |
|---|---|---|---|---|
| 7,560,344 B2* | 7/2009 | Kim | .................. | H01L 21/28273 257/276 |
| 7,829,932 B2* | 11/2010 | Song | .................. | H01L 21/76897 257/315 |

(Continued)

FOREIGN PATENT DOCUMENTS

CN 102194755 A 9/2011
JP 2012018968 A 1/2012

OTHER PUBLICATIONS

USPTO, Notice of Allowance and Fee(s) Due for U.S. Appl. No. 13/759,156, mailed Aug. 22, 2014.

(Continued)

*Primary Examiner* — Mary Wilczewski
(74) *Attorney, Agent, or Firm* — Ingrassia Fisher & Lorenz, P.C.

(57) ABSTRACT

Integrated circuits and methods for fabricating integrated circuits are provided. In one example, an integrated circuit includes a semiconductor substrate. A first fin and a second fin are adjacent to each other extending from the semiconductor substrate. The first fin has a first upper section and the second fin has a second upper section. A first epi-portion overlies the first upper section and a second epi-portion overlies the second upper section. A first silicide layer overlies the first epi-portion and a second silicide layer overlies the second epi-portion. The first and second silicide layers are spaced apart from each other to define a lateral gap. A dielectric spacer is formed of a dielectric material and spans the lateral gap. A contact-forming material overlies the dielectric spacer and portions of the first and second silicide layers that are laterally above the dielectric spacer.

9 Claims, 5 Drawing Sheets

(51) Int. Cl.
*H01L 29/417* (2006.01)
*H01L 29/45* (2006.01)
*H01L 29/78* (2006.01)
*H01L 21/28* (2006.01)
*H01L 29/66* (2006.01)
*H01L 21/8234* (2006.01)

(52) U.S. Cl.
CPC ........ *H01L27/0886* (2013.01); *H01L 29/0653* (2013.01); *H01L 29/41791* (2013.01); *H01L 29/458* (2013.01); *H01L 29/66795* (2013.01); *H01L 29/785* (2013.01)

(56) References Cited

U.S. PATENT DOCUMENTS

| | | | | |
|---|---|---|---|---|
| 7,833,890 B2* | 11/2010 | Kim | .................. | H01L 21/28273 257/276 |
| 7,910,453 B2* | 3/2011 | Xu | .................... | H01L 27/11568 257/374 |
| 8,030,108 B1 | 10/2011 | Lee et al. | | |
| 8,377,779 B1* | 2/2013 | Wang | ................ | H01L 29/66795 257/E21.421 |
| 8,659,032 B2 | 2/2014 | Chao et al. | | |
| 8,697,539 B2 | 4/2014 | Huang et al. | | |
| 8,742,457 B2 | 6/2014 | Yang | | |
| 8,921,191 B2* | 12/2014 | Cai | ..................... | H01L 27/0886 438/300 |
| 8,956,942 B2* | 2/2015 | Loubet | ............ | H01L 21/823431 438/164 |
| 8,999,779 B2* | 4/2015 | Naczas | ................. | H01L 23/535 257/353 |
| 9,214,556 B2* | 12/2015 | Wann | .................... | H01L 29/785 |
| 2007/0231984 A1 | 10/2007 | Metz et al. | | |
| 2008/0111199 A1* | 5/2008 | Kim | .................. | H01L 21/28273 257/401 |
| 2008/0157182 A1* | 7/2008 | Song | ................. | H01L 21/76897 257/321 |
| 2009/0026505 A1* | 1/2009 | Okano | .......................... | 257/255 |
| 2010/0224943 A1 | 9/2010 | Kawasaki | | |
| 2011/0127610 A1* | 6/2011 | Lee | ................. | H01L 21/823431 257/365 |
| 2011/0133285 A1* | 6/2011 | Liaw | .............................. | 257/368 |
| 2011/0193175 A1 | 8/2011 | Huang et al. | | |
| 2011/0210404 A1* | 9/2011 | Su | .......................... | H01L 29/785 257/401 |
| 2011/0298058 A1 | 12/2011 | Kawasaki et al. | | |
| 2013/0109152 A1 | 5/2013 | Huang et al. | | |
| 2013/0134506 A1* | 5/2013 | Yagishita | ....................... | 257/330 |
| 2013/0153960 A1 | 6/2013 | Yang | | |
| 2013/0187228 A1 | 7/2013 | Xie et al. | | |
| 2013/0193446 A1 | 8/2013 | Chao et al. | | |
| 2013/0221414 A1* | 8/2013 | Zhao et al. | ...................... | 257/288 |
| 2013/0330482 A1* | 12/2013 | Leu et al. | ...................... | 427/579 |
| 2014/0001520 A1* | 1/2014 | Glass et al. | ...................... | 257/288 |
| 2014/0084383 A1* | 3/2014 | Cai | ................... | H01L 29/66545 257/401 |
| 2014/0134814 A1* | 5/2014 | Wong et al. | ................... | 438/283 |
| 2014/0134831 A1 | 5/2014 | Chao et al. | | |
| 2014/0167264 A1* | 6/2014 | Besser et al. | ................. | 257/741 |
| 2014/0175554 A1* | 6/2014 | Loubet | ........... | H01L 21/823431 257/368 |
| 2014/0179070 A1 | 6/2014 | Yang | | |
| 2014/0183605 A1 | 7/2014 | Mochizuki et al. | | |
| 2014/0203370 A1 | 7/2014 | Maeda et al. | | |
| 2014/0217517 A1 | 8/2014 | Cai et al. | | |
| 2015/0035023 A1* | 2/2015 | Kim et al. | ...................... | 257/288 |
| 2015/0069531 A1* | 3/2015 | Naczas | ................. | H01L 23/535 257/410 |
| 2015/0076609 A1* | 3/2015 | Xie | .............. | H01L 29/785 257/365 |
| 2015/0137308 A1* | 5/2015 | Akarvardar | ......... | H01L 27/0886 257/506 |
| 2015/0228653 A1* | 8/2015 | Cheng | ................. | H01L 27/0924 257/369 |
| 2015/0255571 A1* | 9/2015 | Xu | ...................... | H01L 29/6681 257/288 |
| 2015/0303118 A1* | 10/2015 | Wang | ............. | H01L 21/823481 257/401 |

OTHER PUBLICATIONS

Intellectual Property Office, Examination Report for Taiwanese Patent Application No. 102130763 mailed May 8, 2015.
Intellectual Property Office, Allowance Decision Letter for Taiwanese Patent Application No. 102130763 mailed Nov. 6, 2015.
Chinese Intellectual Property Office, Official Action for Chinese Patent Application No. 201410044017.7 mailed Mar. 23, 2016.

* cited by examiner

INTEGRATED CIRCUITS INCLUDING FINFET DEVICES WITH LOWER CONTACT RESISTANCE AND REDUCED PARASITIC CAPACITANCE AND METHODS FOR FABRICATING THE SAME

CROSS-REFERENCE TO RELATED APPLICATIONS

This application is a divisional application of U.S. application Ser. No. 13/759,156, filed Feb. 5, 2013, which is hereby incorporated in its entirety by reference.

TECHNICAL FIELD

The technical field relates generally to integrated circuits and methods for fabricating integrated circuits, and more particularly relates to integrated circuits including FINFET devices with lower contact resistance and reduced parasitic capacitance and methods for fabricating such integrated circuits.

BACKGROUND

Transistors such as metal oxide semiconductor field effect transistors (MOSFETs) or simply field effect transistors (FETs) or MOS transistors are the core building blocks of the vast majority of semiconductor integrated circuits (ICs). A FET includes source and drain regions between which a current can flow through a channel under the influence of a bias applied to a gate electrode that overlies the channel. Some semiconductor ICs, such as high performance microprocessors, can include millions of FETs. For such ICs, decreasing transistor size and thus increasing transistor density has traditionally been a high priority in the semiconductor manufacturing industry. Transistor performance, however, must be maintained even as the transistor size decreases.

A FINFET is a type of transistor that lends itself to the goals of reducing transistor size while maintaining transistor performance. The FINFET is a non-planar, three dimensional transistor formed in a thin fin that extends upwardly from a semiconductor substrate. One important challenge with the implementation of FINFETs is the formation of contacts to the non-planar source and drain regions of the fins. There are two approaches for contact formation for FINFETs: formation of contacts to merged fins and formation of contacts to unmerged fins.

For merged fins, a layer of epitaxial silicon is grown on the fins. As a result of the epitaxial growth, adjacent fins become merged. The resulting contact area is large and lacks topographical variation. Therefore, conventional silicide processes can be used to successfully form silicide contacts on the top surfaces of the merged fins.

For unmerged fins, a separate layer of epitaxial doped silicon or silicon germanium is grown on the top of each fin without the epitaxial growth merging adjacent fins. Unmerged fins are required, for example, for Static Random Access Memory (SRAM) devices and the like. Unmerged fins permit the design of SRAM cells with tighter pitch, making the overall chip layout smaller. Interface resistivity (Rs) is a significant factor in the overall contact resistance of an integrated circuit, and the plurality of unmerged fins provides much more contact formation area due to the higher surface area exposed to the silicidation process. The total resistance from the contacts can be significantly lower than that of a merged set of fins, which have a smaller contact surface area and thus higher resistance. However, during contact formation, conductive contact-forming material can be deposited between the lower sections of unmerged fins, leading to higher parasitic capacitance. Lowering the contact resistance of many small unmerged fins and decreasing parasitic capacitance can make a significant difference in circuit performance.

Accordingly, it is desirable to provide integrated circuits that include FINFET devices with lower contact resistance and reduced parasitic capacitance and methods for fabricating such integrated circuits. Moreover, it is desirable to provide integrated circuits that include FINFET devices with lower contact resistance unmerged fins while not increasing parasitic capacitance. Furthermore, other desirable features and characteristics of the present invention will become apparent from the subsequent detailed description and the appended claims, taken in conjunction with the accompanying drawings and this background.

BRIEF SUMMARY

Integrated circuits and methods for fabricating integrated circuits are provided herein. In accordance with an exemplary embodiment, a method for fabricating an integrated circuit includes forming a first fin and a second fin adjacent to each other extending from a semiconductor substrate. A silicon-containing material is selectively epitaxially grown on the first and second fins to form a first epi-portion overlying a first upper section of the first fin and a second epi-portion overlying a second upper section of the second fin. The first and second epi-portions are spaced apart from each other. A first silicide layer is formed overlying the first epi-portion and a second silicide layer is formed overlying the second epi-portion. The first and second silicide layers are spaced apart from each other to define a lateral gap. A dielectric material is deposited overlying the first and second silicide layers to form a dielectric spacer that spans the lateral gap. The dielectric material that overlies portions of the first and second silicide layers laterally above the dielectric spacer is removed while leaving the dielectric spacer intact. A contact-forming material is deposited overlying the dielectric spacer and the portions of the first and second silicide layers.

In accordance with another exemplary embodiment, a method for fabricating an integrated circuit is provided. The method includes forming a first fin and a second fin adjacent to each other extending from a semiconductor substrate. A silicon-containing material is selectively epitaxially grown on the first and second fins to form a first diamond-shaped/cross-section epi-portion disposed on a first upper section of the first fin and a second diamond-shaped/cross-section epi-portion disposed on a second upper section of the second fin. The first diamond-shaped/cross-section epi-portion has a first upper surface and a first lower surface. The second diamond-shaped/cross-section epi-portion has a second upper surface and a second lower surface. The first and second diamond-shaped/cross-section epi-portions are spaced apart from each other. A first silicide layer is formed along the first upper and lower surfaces of the first diamond-shaped/cross-section epi-portion and a second silicide layer is formed along the second upper and lower surfaces of the second diamond-shaped/cross-section epi-portion. The first and second silicide layers are spaced apart from each other to define a lateral gap. A dielectric material is deposited overlying the first and second silicide layers to form a dielectric spacer that closes off the lateral gap. The dielectric material is etched to expose upper portions of the first and second silicide layers that overlie the first and second upper surfaces of the first and second diamond-shaped/cross-section epi-portions, respectively, while leaving the dielectric spacer intact. An ILD layer of insulating material is deposited overlying the dielectric spacer and the upper portions of the first and second silicide layers. The ILD layer is etched to form a contact opening that is formed through the ILD layer to expose the upper portions of the first and second silicide layers. A contact-forming material is deposited into the contact opening.

In accordance with another exemplary embodiment, an integrated circuit is provided. The integrated circuit includes a semiconductor substrate. A first fin and a second fin are adjacent to each other extending from the semiconductor substrate. The first fin has a first upper section and the second fin has a second upper section. A first epi-portion overlies the first upper section and a second epi-portion overlies the second upper section. The first and second epi-portions are spaced apart from each other. A first silicide layer overlies the first epi-portion and a second silicide layer overlies the second epi-portion. The first and second silicide layers are spaced apart from each other to define a lateral gap. A dielectric spacer is formed of a dielectric material and spans the lateral gap. A contact-forming material overlies the dielectric spacer and portions of the first and second silicide layers that are laterally above the dielectric spacer.

BRIEF DESCRIPTION OF THE DRAWINGS

The various embodiments will hereinafter be described in conjunction with the following drawing figures, wherein like numerals denote like elements, and wherein.

DETAILED DESCRIPTION

The following Detailed Description is merely exemplary in nature and is not intended to limit the various embodiments or the application and uses thereof. Furthermore, there is no intention to be bound by any theory presented in the preceding background or the following detailed description.

Integrated circuits (ICs) can be designed with millions of transistors. Many ICs are designed using metal oxide semiconductor (MOS) transistors, also known as field effect transistors (FETs) or MOSFETs. Although the term "MOS transistor" properly refers to a device having a metal gate electrode and an oxide gate insulator, that term used herein refers to any device that includes a conductive gate electrode (whether metal or other conductive material) that is positioned over a gate insulator (whether oxide or other insulator) which, in turn, is positioned over a semiconductor substrate. One type of MOS transistor used in the design of ICs is a FINFET, which can be fabricated as a P-channel transistor or as an N-channel transistor, and can also be fabricated with or without mobility enhancing stress features. A circuit designer can mix and match device types, using P-channel and N-channel, FINFET and other types of MOS transistors, stressed and unstressed, to take advantage of the best characteristics of each device type as they best suit the circuit being designed.

Figure 1:
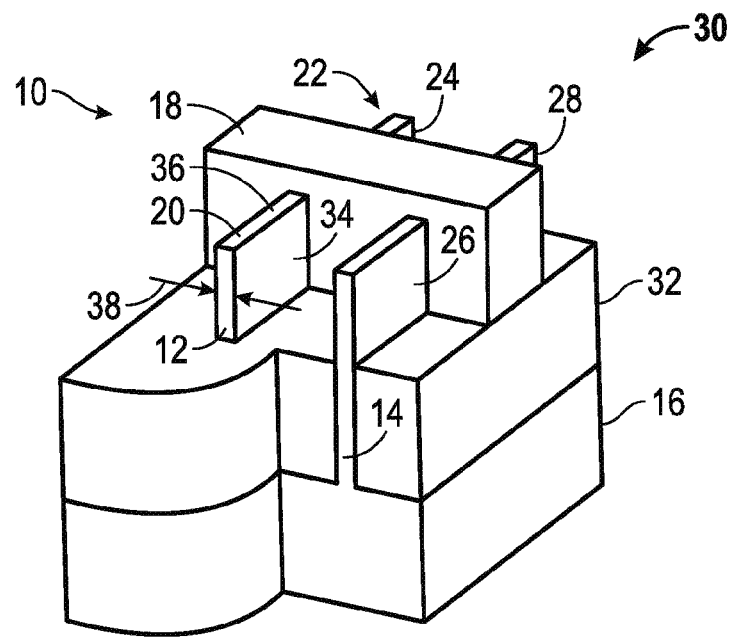
FIG. 1 illustrates a FINFET in a partially cut away perspective view.

The following brief explanation is provided to identify some of the unique features of FINFETs. FIG. 1 illustrates, in a cut away perspective view, a portion of a FINFET integrated circuit (IC) 10. As illustrated, the IC 10 includes two fins 12 and 14 that are formed from and extend upwardly from a semiconductor substrate 16 (e.g., a bulk semiconductor substrate or silicon-on-insulator (SOI) semiconductor substrate). A gate electrode 18 overlies the two fins 12 and 14 and is electrically insulated from the fins 12 and 14 by a gate insulator (not illustrated). An end 20 of the fin 12 is appropriately impurity doped to form a source of a FINFET 22, and an end 24 of the fin 12 is appropriately impurity doped to form a drain of the FINFET 22. Similarly, the ends 26 and 28 of the fin 14 form the source and drain, respectively, of another FINFET 30.

The illustrated portion of IC 10 thus includes two FINFETs 22 and 30 having a common gate electrode 18. In another configuration, if the ends 20 and 26 that form the sources are electrically coupled together and the ends 24 and 28 that form the drains are electrically coupled together, the structure would be a two-fin FINFET having twice the gate width of either FINFET 22 or 30. An oxide layer 32 (e.g., deposited onto the semiconductor substrate 16 if the semiconductor substrate 16 is a bulk semiconductor substrate, or alternatively, is part of the semiconductor substrate 16 if the semiconductor substrate 16 is an SOI semiconductor substrate) forms electrical isolation between the fins 12 and 14 and between adjacent devices as is needed for the circuit being implemented. The channel of the FINFET 22 extends along a sidewall 34 of the fin 12 beneath the gate electrode 18, along a top 36 of the fin 12, as well as along an opposite sidewall not visible in this perspective view. The advantage of the FINFET structure is that although the fin 12 has only the narrow width represented by the arrows 38, the channel has a width represented by at least twice the height of the fin 12 above the oxide layer 32. The channel width thus can be much greater than fin width.

The fins 12 and 14 are formed according to known processes. For instance, when using a SOI semiconductor substrate as the semiconductor substrate 16, portions of the top silicon layer of the semiconductor substrate 16 are etched or otherwise removed leaving the fins 12 and 14 formed from silicon remaining on the underlying oxide layer 32. As shown, the gate electrode 18 is formed across the fins 12 and 14. Gate oxide and/or nitride capping layers (not shown) may be deposited over the fins 12 and 14 before the gate electrode 18 is formed. The gate electrode 18 is formed by typical lithographic processing.

FIGS. 2-9 illustrate methods for forming the IC 10 in accordance with various embodiments. In particular, FIGS. 2-9 are cross-sectional views of the source or drain regions 20, 26 or 24, 28 of the fins 12 and 14 shown in FIG. 1 during various subsequent stages in the fabrication of the IC 10. The described process steps, procedures, and materials are to be considered only as exemplary embodiments designed to illustrate to one of ordinary skill in the art methods for practicing the methods contemplated herein; the methods are not limited to these exemplary embodiments. The illustrated portion of the IC 10 as shown includes only two FINFETs 22 and 30, although those of skill in the art will recognize that an actual IC could include a large number of such transistors. Various steps in the manufacture of ICs are well known and so, in the interest of brevity, many conventional steps will only be mentioned briefly herein or will be omitted entirely without providing the well known process details.

Figure 2:
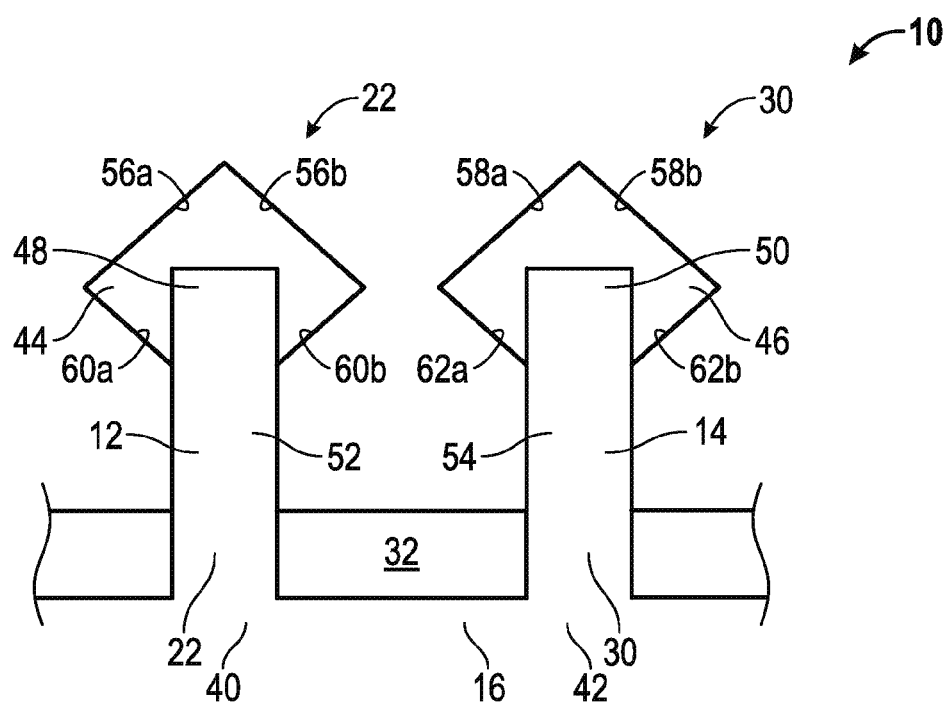
FIGS. 2-9 illustrate in cross-sectional views an integrated circuit and methods for fabricating an integrated circuit during various stages of its fabrication in accordance with an exemplary embodiment.

FIG. 2 illustrates, in cross-sectional view, a portion of the IC 10 at an intermediate fabrication stages in accordance with an exemplary embodiment. As discussed above, the fins 12 and 14 have been formed adjacent to each other extending from the semiconductor substrate 16 and extending above the oxide layer 32. Further patterning, implanting, and annealing processes are employed to form wells 40 and 42 in the semiconductor substrate 16 below the fins 12 and 14. A selective epitaxial growth process is used to grow a silicon-containing material overlying the upper sections 48 and 50 of the fins 12 and 14 to form epi-portions 44 and 46, respectively. In an exemplary embodiment, the silicon-containing material is silicon phosphorus (SiP) for N-type FINFETs or silicon germanium (SiGe) for P-type FINFETs.

The epi-portions 44 and 46 are spaced apart from each other such that the fins 12 and 14 are not merged to define unmerged fins 52 and 54. As illustrated, the epi-portions 44 and 46 are configured as having "diamond-shaped/cross-sections." The diamond-shaped/cross-sections of the epi-portions 44 and 46 form due to the slower rate of growth of the silicon-containing material on the (111) surface of the fins 12 and 14. As such, the epi-portions 44 and 46 have corresponding upper surfaces 56a, 56b, 58a, and 58b and lower surfaces 60a, 60b, 62a, and 62b. The lower surfaces 60a, 60b, 62a, and 62b face towards the semiconductor substrate 16 and the upper surfaces 56a, 56b, 58a, and 58b are positioned beyond the lower surfaces 60a, 60b, 62a, and 62b facing away from the semiconductor substrate 16.

Figure 3:
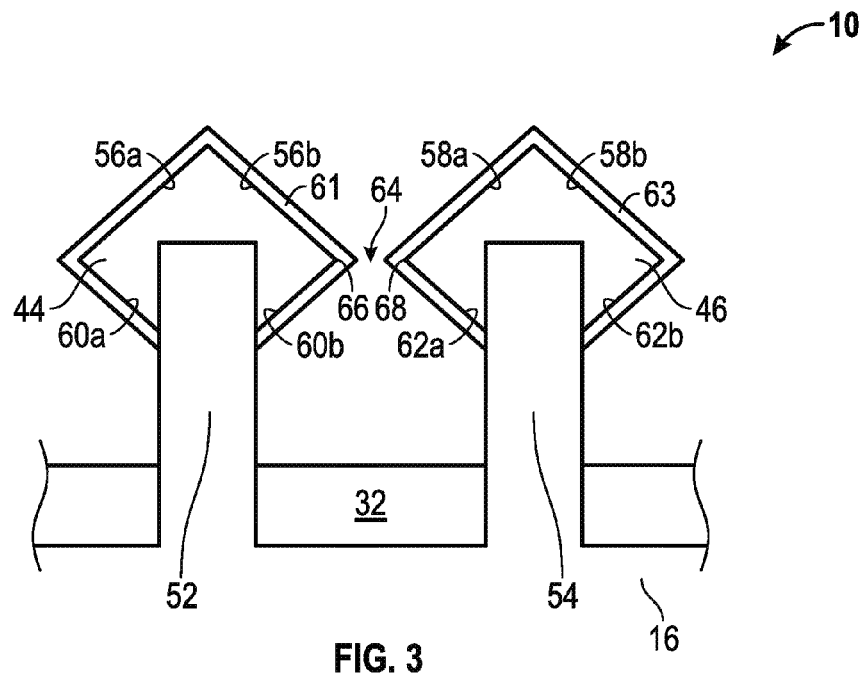

FIG. 3 illustrates, in cross-sectional view, a portion of the IC 10 at a further advanced fabrication stage in accordance with an exemplary embodiment. Using a silicidation process, silicide layers 61 and 63 are formed over the epi-portions 44 and 46, respectively. The silicide layers 61 and 63 are formed by depositing a silicide-forming metal overlying the upper surfaces 56a, 56b, 58a, and 58b and the lower surfaces 60a, 60b, 62a, and 62b of the epi-portions 44 and 46, and heating the silicide-forming metal, for example by rapid thermal anneal (RTA), to cause the silicide-forming metal to react with exposed silicon-containing material in the epi-portions 44 and 46. Examples of silicide-forming metals include, but are not limited to, nickel, cobalt, and alloys thereof. The silicide-forming metal can be deposited, for example by sputtering, to a thickness of from about 3 to about 10 nm, such as about 7 nm. Any unreacted silicide-forming metal can be removed, for example, by wet etching in a $H_2O_2/H_2SO_4$ or $HNO_3/HCl$ solution. In an exemplary embodiment, the silicide layers 61 and 63 each have a thickness of from about 3 to about 10 nm. Notably, the silicide formation at both the bottoms and tops of the diamond shaped epi-portions 44 and 46 helps maximizes the contact surface area thus reducing contact resistance.

As illustrated, the silicide layers 61 and 63 are spaced apart from each other such that a lateral gap 64 is defined between the silicide layers 61 and 63 proximate the mid-corners 66 and 68 of the diamond-shaped/cross-section of the epi-portions 44 and 46. In an exemplary embodiment, the lateral gap is from about 3 to about 7 nm.

Figure 4:
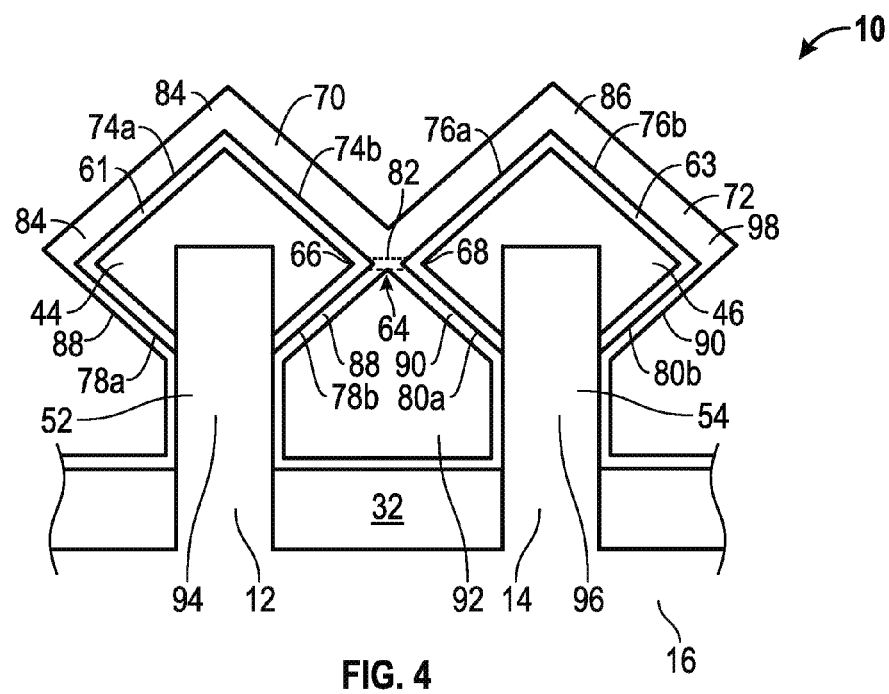

The process continues as illustrated in FIG. 4 by depositing a dielectric material over the oxide layer 32 and the unmerged fins 52 and 54 including the silicide layers 61 and 63. In an exemplary embodiment, the dielectric material is deposited using an atomic layer deposition (ALD) process and comprises silicon nitride (SiN), which may be doped with carbon atoms (C), nitrogen atoms (N), and/or oxygen atoms (O).

During deposition, the dielectric material accumulates on the upper and lower portions 74a, 74b, 76a, 76b, 78a, 78b, 80a, and 80b of the silicide layers 61 and 63 and the surrounding area to form dielectric films 70 and 72. As the thicknesses of the dielectric films 70 and 72 increase, the dielectric films 70 and 72 merged together proximate the mid-corners 66 and 68 of the diamond-shaped/cross-sections of the epi-portions 44 and 46 to integrally form a dielectric spacer 82 (indicated by dashed lines). As illustrated, the dielectric spacer 82 spans and closes off the lateral gap 64.

In an exemplary embodiment, the dielectric spacer 82 has a lateral dimension of at least about 3 nm, such as about 3 to about 10 nm, for example from about 3 to about 7 nm to close off the lateral gap 64. As illustrated, to facilitate keeping the dielectric spacer 82 intact during subsequent processing, as will be discussed in further detail below, the upper dielectric film sections 84 and 86 that overlie the upper portions 74a, 74b, 76a, and 76b of the silicide layers 61 and 63, respectively, are formed thicker (e.g., with overgrowth) than the lower dielectric film sections 88 and 90 that overlie the lower portions 78a, 78b, 80a, and 80b of the silicide layers 61 and 63, respectively. In an exemplary embodiment, the upper dielectric film sections 84 and 86 are formed each having a thickness of about 5 to about 15 nm and the lower dielectric film sections 88 and 90 are each formed having a thickness of from about 2 to about 7 nm. As illustrated, a void 92 is disposed beneath the dielectric spacer 82 between the semiconductor substrate 16, the lower sections 94 and 96 of the fins 12 and 14, and the lower dielectric film sections 88 and 90. Notably, in an exemplary embodiment, the void 92 enables air trapping beneath the dielectric spacer 82, and together with the low-k characteristics of the dielectric spacer 82, enables very low parasitic capacitance.

Figure 5:
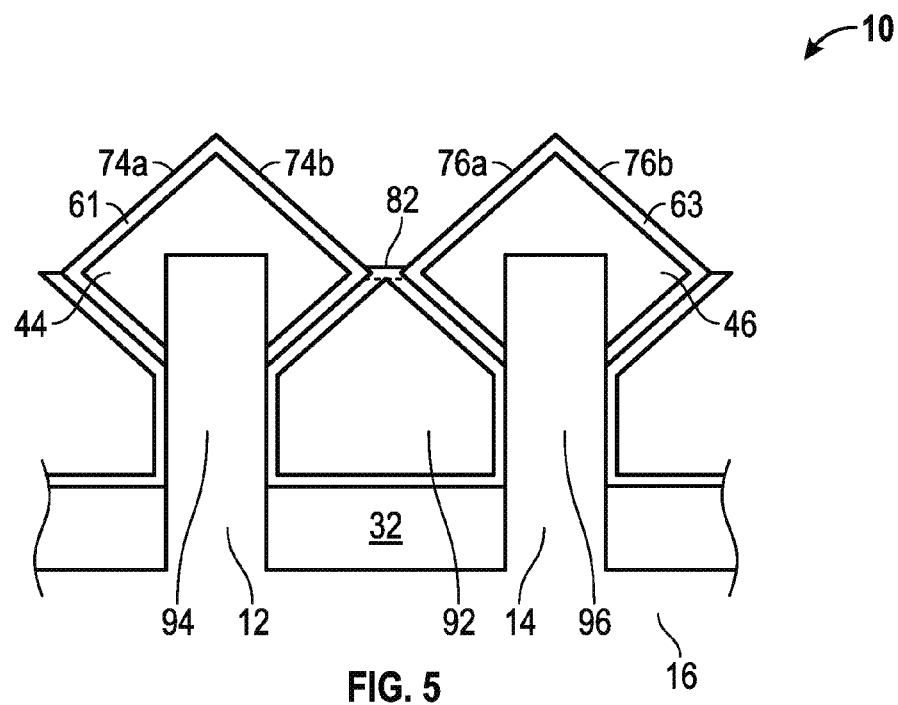

FIG. 5 illustrates, in cross-sectional view, a portion of the IC 10 at a further advanced fabrication stage in accordance with an exemplary embodiment. The upper dielectric film sections 84 and 86 (see FIG. 4) are removed by etching the dielectric material to expose the upper portions 74a, 74b, 76a, and 76b of the silicide layers 61 and 63 while leaving the dielectric spacer 82 intact. In one embodiment, the dielectric material is etched using a dry etching process, such as a plasma etching process, for example reactive ion etching (RIE). In another embodiment, the dielectric material is etched using a wet etching process, such as a hot phosphoric acid etching process at a temperature of about 160 to about 170° C. By leaving the dielectric spacer 82 intact, the void 92 is protectively covered to reduce, minimize, or prevent further deposition of any conducting materials (e.g., contact-forming material, such as W and/or the like) adjacent to and in between the lower sections 94 and 96 of the fins 12 and 14 that might otherwise increase parasitic capacitance.

Figure 6:
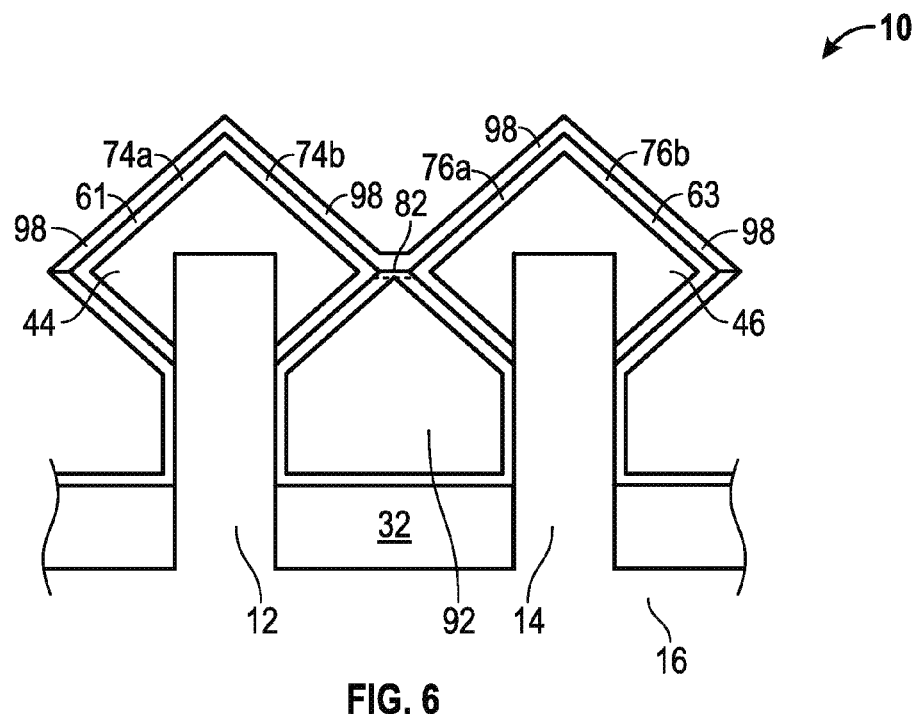
Figure 7:
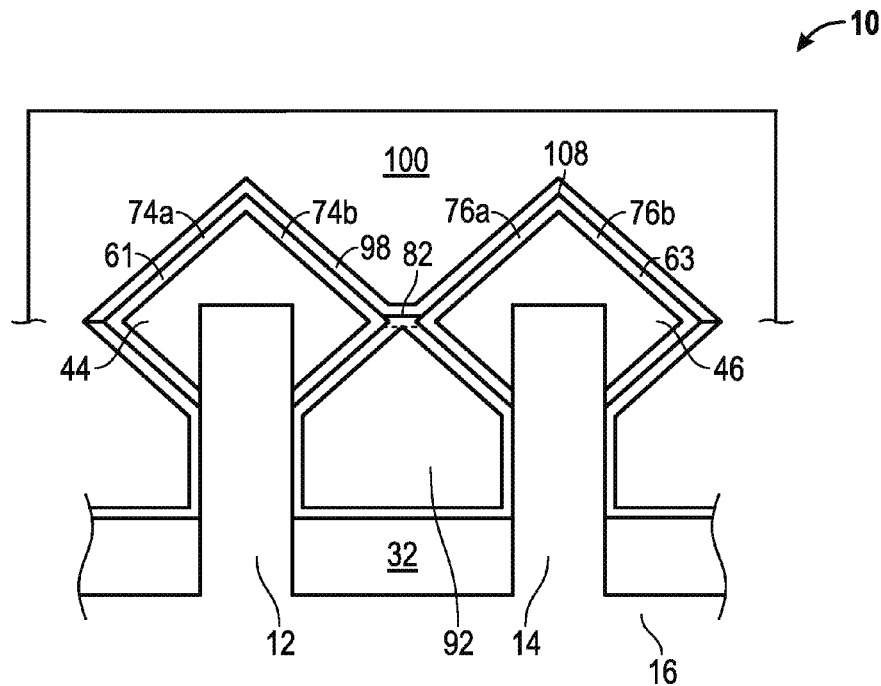

The method continues as illustrated in FIGS. 6 and 7 by forming a nitride etch layer 98 overlying the dielectric spacer 82 and the upper portions 74a, 74b, 76a, and 76b of the silicide layers 61 and 63. An ILD layer 100 of insulating material (e.g., silicon oxide) is then deposited overlying the nitride etch stop layer 98. In an exemplary embodiment, the ILD layer 100 is deposited by a low pressure chemical vapor deposition (LPCVD) process. The ILD layer 100 is then planarized, for example, by a chemical mechanical planarization (CMP) process.

Figure 8:
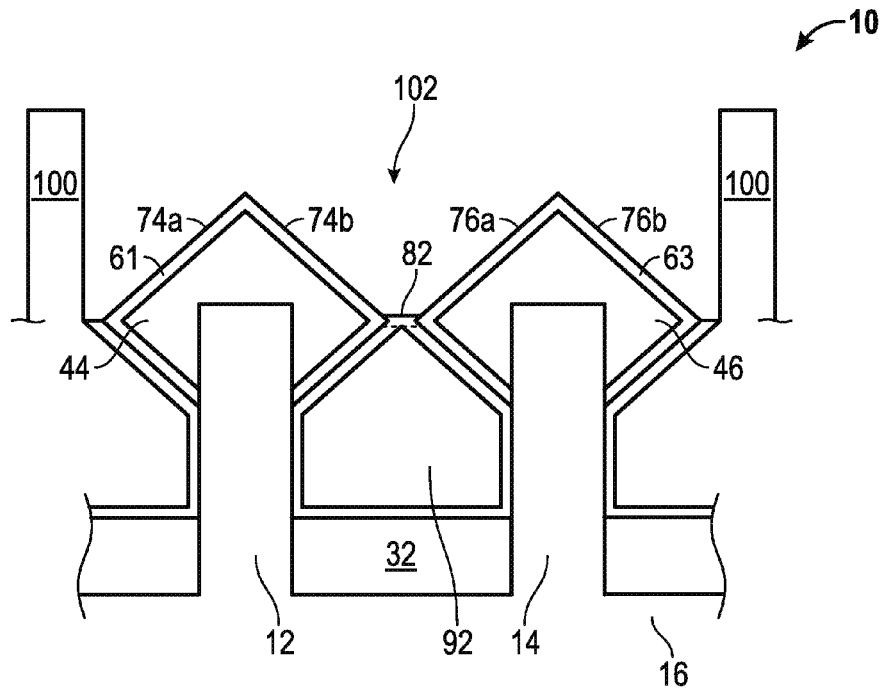
Figure 9:
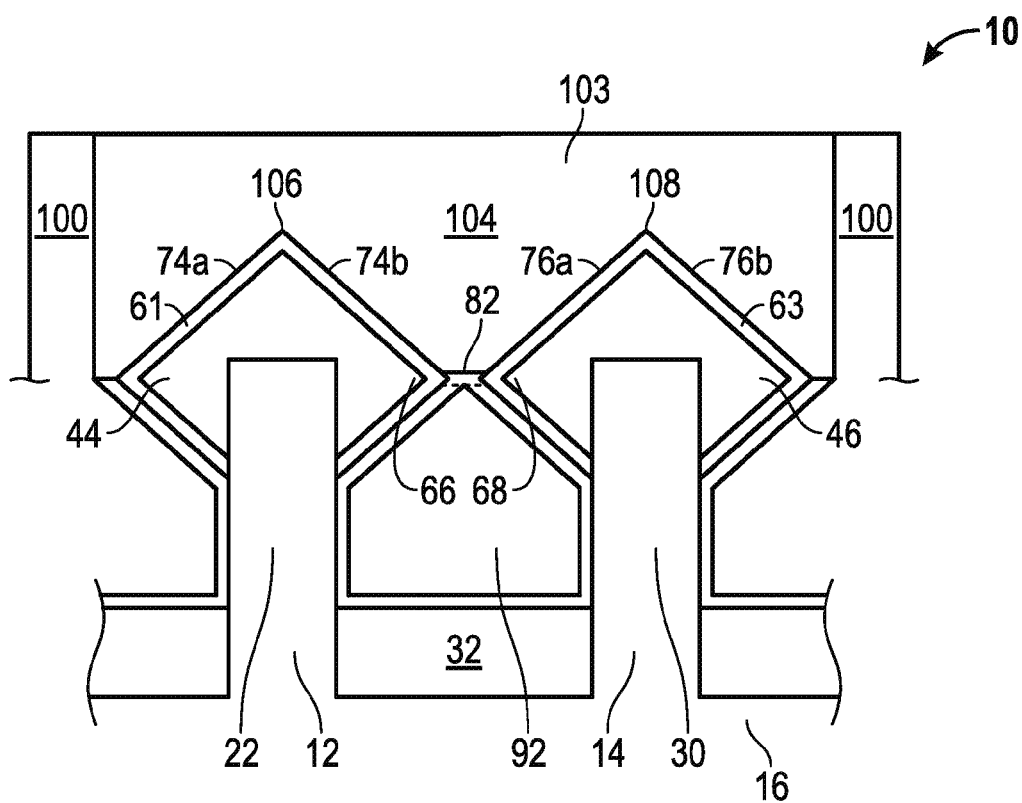

FIGS. 8-9 illustrate, in cross sectional views, the IC 10 at further advanced fabrication stages in accordance with an exemplary embodiment. The method continues by etching through the ILD layer 100 and the nitride etch stop layer 98 to form a contact opening 102. As illustrated, the contact opening 102 exposes the dielectric spacer 82 and the upper portions 74a, 74b, 76a, and 76b of the silicide layers 61 and 63. A contact-forming material 103 (e.g., conductive metal) is deposited into the contact opening 102 to form a contact plug 104 that overlies the dielectric spacer 82 and the upper portions 74a, 74b, 76a, and 76b of the silicide layers 61 and 63. In an exemplary embodiment, the contact-forming material 103 is tungsten (W). As illustrated, the void 92, which has been protectively covered by the dielectric spacer 82 during deposition of the contact forming material 103, is substantially free of the contact-forming material 103, thereby reducing parasitic capacitance compared to conventional ICs with unmerged fins. Additionally, the contact plug 104 contacts the silicide layers 61 and 63 horizontally up from about the mid-corners 66 and 68 of the epi-portions 44 and 46 to the uppermost portions 106 and 108 of the silicide layers 61 and 63. As such, the FINFETs 22 and 30 have more contact area and thus lower contact resistance than conventional FINFET devices with unmerged fins that have small contacts formed only at the very tops of the fins. Any excess contact-forming material that is disposed above the ILD layer 100 is then removed using CMP.

Accordingly, integrated circuits including FINFET devices and methods for fabricating such integrated circuits have been described. In an exemplary embodiment, unmerged fins are formed in which a first fin has a first epi-portion and a second fin has a second epi-portion. A first silicide layer is formed overlying a first epi-portion and a second silicide layer is formed overlying the second epi-portion. The first and second silicide layers are spaced apart from each other to define a lateral gap. A dielectric material is deposited overlying the first and second silicide layers to form a dielectric spacer that spans the lateral gap. The dielectric material that overlies portions of the first and second silicide layers laterally above the dielectric spacer is removed while leaving the dielectric spacer intact. A contact-forming material is deposited overlying the dielectric spacer and the portions of the first and second silicide layers.

While at least one exemplary embodiment has been presented in the foregoing detailed description of the disclosure, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing an exemplary embodiment of the disclosure. It being understood that various changes may be made in the function and arrangement of elements described in an exemplary embodiment without departing from the scope of the disclosure as set forth in the appended claims.

What is claimed is:
1. An integrated circuit comprising:
a semiconductor substrate;
a first fin and a second fin adjacent to each other extending from the semiconductor substrate, wherein the first fin has a first upper section and the second fin has a second upper section;
a first epi-portion overlying the first upper section and a second epi-portion overlying the second upper section, wherein the first and second epi-portions are spaced apart from each other;
a first silicide layer overlying the first epi-portion and a second silicide layer overlying the second epi-portion, wherein the first and second silicide layers are spaced apart from each other to define a lateral gap, and wherein the first and second silicide layers comprise lower portions of the silicide layers;
a dielectric spacer formed of a dielectric material and spanning the lateral gap above a void that is disposed between the first and second fins, wherein the dielectric spacer has a lateral dimension of at least about 3 nm to close off the lateral gap;
lower dielectric film sections overlying the lower portions of the silicide layers, wherein the lower dielectric film sections have a thickness of from about 2 to about 7 nanometers, and wherein the void is disposed between the lower dielectric film sections; and
a contact-forming material overlying the dielectric spacer and portions of the first and second silicide layers that are laterally above the dielectric spacer.

2. The integrated circuit of claim 1, wherein the first epi-portion is a first diamond-shaped/cross-section epi-portion having a first upper surface and a first lower surface and the second epi-portion is a second diamond-shaped/cross-section epi-portion having a second upper surface and a second lower surface, and wherein the first silicide layer is disposed along the first upper and lower surfaces of the first diamond-shaped/cross-section epi-portion and the second silicide layer is disposed along the second upper and lower surfaces of the second diamond-shaped/cross-section epi-portion.

3. The integrated circuit of claim 1, wherein the dielectric spacer has the lateral dimension of about 3 to about 10 nm to close off the lateral gap.

4. The integrated circuit of claim 1, wherein the first and second silicide layers have a thickness such that the lateral gap is from about 3 to about 7 nm.

5. The integrated circuit of claim 1, wherein the contact-forming material comprises tungsten.

6. An integrated circuit comprising:
a semiconductor substrate;
a first fin and a second fin adjacent to each other extending from the semiconductor substrate, wherein the first fin has a first upper section and the second fin has a second upper section;
a first epi-portion overlying the first upper section and a second epi-portion overlying the second upper section, wherein the first and second epi-portions are spaced apart from each other;
a first silicide layer overlying the first epi-portion and a second silicide layer overlying the second epi-portion, wherein the first and second silicide layers are spaced apart from each other to define a lateral gap;
a dielectric spacer formed of a dielectric material and spanning the lateral gap; and
a contact-forming material overlying the dielectric spacer and portions of the first and second silicide layers that are laterally above the dielectric spacer, wherein the first epi-portion is a first diamond-shaped/cross-section epi-portion having a first upper surface and a first lower surface and the second epi-portion is a second diamond-shaped/cross-section epi-portion having a second upper surface and a second lower surface, wherein the first silicide layer is disposed along the first upper and lower surfaces of the first diamond-shaped/cross-section epi-portion and the second silicide layer is disposed along the second upper and lower surfaces of the second diamond-shaped/cross-section epi-portion, and wherein the first and second silicide layers have lower portions that overlie the first and second lower surfaces of the first and second diamond-shaped/cross-section epi portions, and wherein the integrated circuit further comprises:
a first dielectric film overlying the lower portion of the first silicide layer; and
a second dielectric film overlying the lower portion of the second silicide layer, wherein the dielectric spacer is integrally formed with the first and second dielectric films, and wherein the first and second dielectric films overlying the lower portion of the first and second silicide layers, respectively, have a thickness of from about 2 to about 7 nanometers.

7. The integrated circuit of claim 6, wherein the first fin has a first lower section disposed below the first diamond-shaped/ cross-section epi-portion and the second fin has a second lower section disposed below the second diamond-shaped/cross-section epi-portion, and wherein the semiconductor substrate, the first and second lower sections of the first and second fins, the first and second lower dielectric film sections, and the dielectric spacer together surround a void.

8. The integrated circuit of claim 7, wherein the void is free of the contact-forming material.

9. An integrated circuit comprising:
a semiconductor substrate;
a first fin and a second fin adjacent to each other extending from the semiconductor substrate, wherein the first fin has a first upper section and the second fin has a second upper section;
a first epi-portion overlying the first upper section and a second epi-portion overlying the second upper section, wherein the first and second epi-portions are spaced apart from each other;
a first silicide layer overlying the first epi-portion and a second silicide layer overlying the second epi-portion, wherein the first and second silicide layers are spaced apart from each other to define a lateral gap, and wherein first and second silicide layers comprise lower portions of the silicide layers;
a dielectric spacer formed of a dielectric material and spanning the lateral gap above a void that is disposed between the first and second fins;
lower dielectric film sections overlying the lower portions of the silicide layers, wherein the lower dielectric film sections have a thickness of from about 2 to about 7 nanometers, and wherein the void is disposed between the lower dielectric film sections; and
a contact-forming material overlying the dielectric spacer and portions of the first and second silicide layers that are laterally above the dielectric spacer, wherein the dielectric material comprises SiN doped with C, N, O, or combinations thereof.

* * * * *